United States Patent [19]

Opas

[11] Patent Number: 5,023,937

[45] Date of Patent: Jun. 11, 1991

[54] TRANSMITTER WITH IMPROVED LINEAR AMPLIFIER CONTROL

[75] Inventor: George F. Opas, Park Ridge, Ill.

[73] Assignee: Motorola, Inc., Schaumburg, Ill.

[21] Appl. No.: 349,479

[22] Filed: May 9, 1989

[51] Int. Cl.[5] .............................................. H04B 1/04
[52] U.S. Cl. ...................................... 455/126; 331/14
[58] Field of Search ............... 455/125, 126, 115, 124;
332/107, 124, 127, 160; 331/14

[56] References Cited

U.S. PATENT DOCUMENTS

| | | | |
|---|---|---|---|
| 4,035,727 | 7/1977 | Ishii | 455/119 |
| 4,639,938 | 1/1987 | Kennett | 455/126 |
| 4,933,986 | 6/1990 | Leitch | 455/126 |

Primary Examiner—Reinhard J. Eisenzopf
Assistant Examiner—Lisa Charouel
Attorney, Agent, or Firm—Charles L. Warren

[57] ABSTRACT

A linear power amplifier is included in a RF transmitter. A mechanism is provided for generating a predistorted input signal to the PA so that nonlinear phase and amplitude characteristics of the PA will be compensated. Another means is provided for generating a feedback signal to the predistortion generating mechanism so that the feedback signal is based on the output of the PA when the predistortion circuit is locked and is based upon the input signal to the PA when the predistortion generating circuit is unlocked. Undesired emissions from the power amplifier are inhibited when the predistortion mechanism is unlocked.

16 Claims, 2 Drawing Sheets

TRANSMITTER WITH IMPROVED LINEAR AMPLIFIER CONTROL

BACKGROUND OF THE INVENTION

This invention is generally directed to transmitters having a linear final power amplifier (PA) and more specifically directed to such amplifiers which are corrected for amplitude or phase distortion by predistorting the input signal to the PA.

Linear amplifiers are needed when nonconstant envelope amplitude modulated signals are to be amplified such as in a single sideband transmitter. Even "linear" amplifiers do not provide an output signal which is an amplified exact duplicate of the input signal with regard to magnitude and phase.

In an effort to correct for such nonlinearities, circuits have been devised which "predistort" the input signal to a PA to take into account the nonlinearities of the PA so that its output has increased linearity. Typically the PA output signal is sampled and utilized as a feedback signal by such circuitry to generate the predistorted signal.

Since the PA must be operating in order to generate the feedback signal, problems can occur with regard to off-frequency or other unauthorized transmissions should a phase locked loop (PLL) in the predistortion circuit become unlocked. A temporary unlocked condition could be caused by a change in operating frequency or a transient condition that affects the predistortion circuit or the PA.

SUMMARY OF THE INVENTION

It is an object of the present invention to provide a transmitter having a linear power amplifier with a predistortion circuit which provides improved linearity and which inhibits the operation of the PA when such circuit is in an unlocked state.

In one embodiment according to the present invention, a radio frequency (RF) transmitter includes a linear PA and a mean which includes a PLL for generating an input signal to the PA based upon a signal from an exciter and a second signal. The input signal to the PA is predistored to account for nonlinear characteristics of the PA. Another means is provided for generating the second signal so that is is based upon the output of the PA when the PLL is in its locked state and is based upon the input signal to the PA when the PLL is in its unlocked state. The PA is inhibited when the PLL is in its unlocked state thereby minimizing undesired transmissions.

DESCRIPTION OF PREFERRED EMBODIMENT

Figure 1:
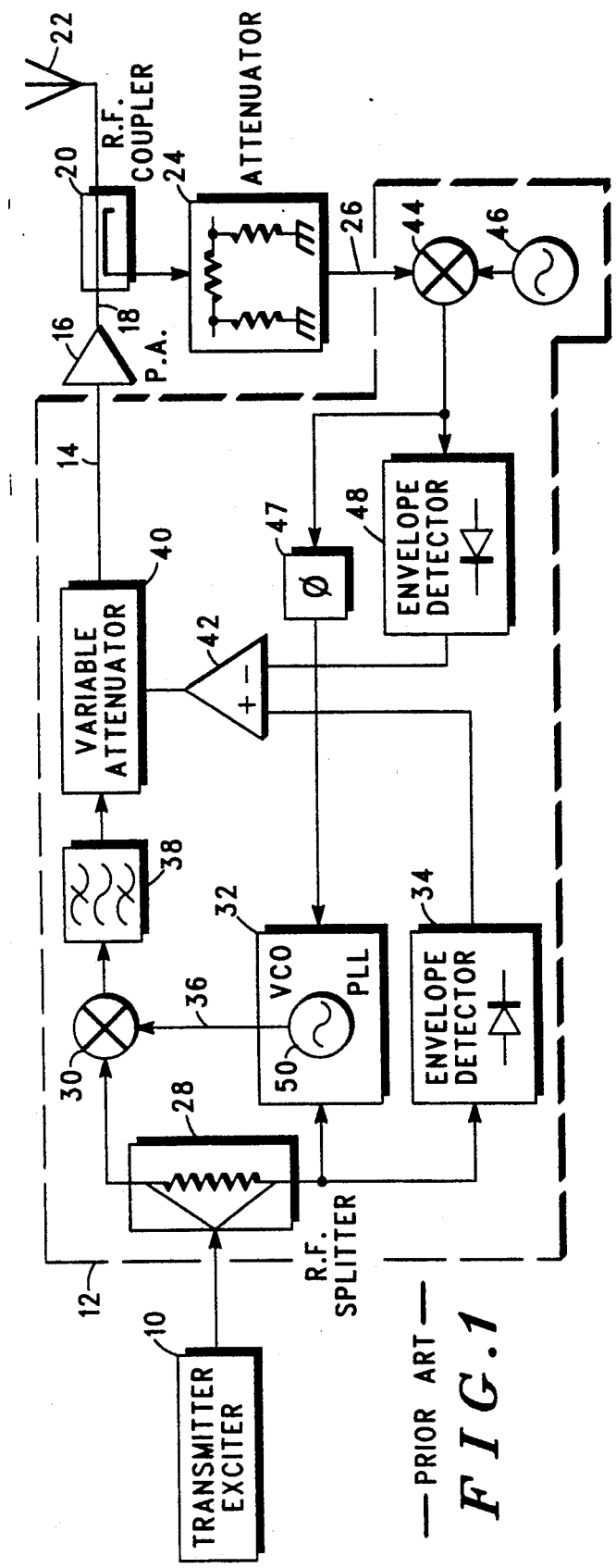
FIG. 1 is a block diagram of a transmitter utilizing a linear PA and circuitry which provides a predistored input signal to the PA.

FIG. 1 illustrates a prior art implementation of a transmitter which utilizes a linear PA and circuitry for providing a predistored signal to the PA. This embodiment illustrates a signal sideband RF transmitter which includes a transmitter exciter 10 and a polar loop circuit 12 which provides a predistored signal 14 to PA 16. The output 18 of the PA is coupled to antenna 22 by means of an RF coupler 20 which also samples the PA output signal. The sample signal is attenuated by attenuator 24 before being coupled as the feedback input signal 26 to circuit 12.

In circuit 12, an RF splitter 28 splits the input signal from exciter 10 and provides inputs to mixer 30, PLL 32 and envelope detector 34. The output 36 of PLL 32 provides the other input to mixer 30. The output of the mixer consists of a frequency translated signal which is filtered by bandpass filter 38. The amplitude of the signal is controlled by variable attenuator 40. The output of attenuator 40 consists of the predistored signal 14 which is applied as an input to PA 16.

The variable attenuator is controlled by the output of comparator 42 which compares two inputs. The feedback signal 26 from PA 16 provides an input to mixer 44. The other input to mixer 44 consists of a local oscillator 46. The output of the mixer is coupled to envelope detector 48 and to PLL 32 after being shifted in phase by 90 degrees by phase shifter 47. The PLL includes a voltage controlled oscillator (VCO) 50 which varies in response to phase differencers between the two input signals to the PLL and a conventional circuit which provides a binary signal that corresponds to locked and unlocked states of the PLL. The output of envelope detector 48 provides one input to comparator 42 with the other input being provided by the output of envelope detector 34.

The input signal 36 to mixer 30 includes a phase correction which is intended to provide a predistored phase signal to PA 16 to minimize phase distortions at its output 18. Variable attenuator 40 modulates the amplitude of the input signal 14 to compensate for nonlinear amplitude variations in PA 16. Thus both amplitude and phase corrections are accomplished.

Figure 2:
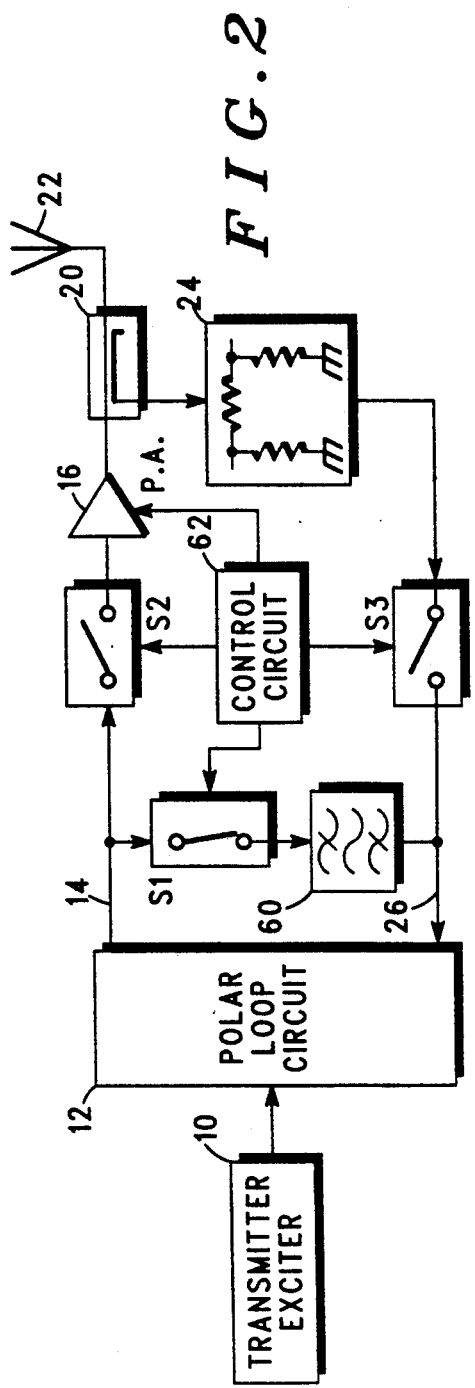
FIG. 2 is a block diagram of an embodiment of a transmitter according to the present invention.

FIG. 2 illustrates an embodiment of a transmitter according to the present invention which includes a linear PA 16 and a predistortion or polar loop circuit 12. The present invention seeks to minimize undesired or of frequency transmissions by PA 16 which can occur when an unlocked condition exists within polar loop circuit 12. As used herein PA means a power amplifier which includes at least the final stage of amplification.

In accordance with the present invention, two paths exist by which a feedback signal 26 to polar loop circuit 12 can be derived. A short loop path exists by which the predistored signal 14 is coupled by switch S1 and resonator 60 to constitute feedback signal 26. When the short loop is selected, switch S1 is closed and switches S2, S3 are open. The short loop is engaged when polar loop circuit 12 is unlocked thereby preventing drive signal 14 from reaching the PA 16 and minimizing the transmission of undesired signals. Switch S3 breaks the feedback path from the sampled output signal of the PA.

A long loop path exists whereby input signal 26 is derived from predistored input signal 14 as coupled through elements S2, PA 16, coupled 20, attenuator 24, and switch S3. The long loop will be active when the polar loop circuit 12 is locked. In this condition switches S2, S3 will be closed and switch S1 will be open. Thus the short loop is effectively decoupled when the long loop is active. A control circuit 62 controls the operation of the switches S1-S3.

Attention should be given to the way in which the transition from the short loop to the long loop is accomplished. Once the polar loop circuit 12 has changed from the unlocked to locked condition, it is desirable that the opening of switch S1 and closing of switches S2, S3 effectuate a graduated attenuation change so as not to introduce a transient which would cause the polar loop circuit to become unlocked. Thus, it is desired that switches S2, S3 provide at least some level of conduction prior to switch S1 becoming nonconductive.

To preclude the possibility of undesired oscillation which could occur when both the long loop and short loop are connected during the switching transition, it is desirable to place at least a single pole resonator in the loop to provide additional attenuation at frequencies outside of the normal frequency band of operation. Use of the resonator is recommended when the switches are implemented by the use of PIN diodes in a switching arrangement which is frequency sensitive such as will be described in regard to FIG. 3. The insertion of the resonator 60 in the short loop is preferred to insertion in the long loop so that it will not add to the substantial delay already present in the long loop.

When the short loop is active during an unlocked condition, it may also be useful to disable the power supply from one or more stages of the PA 16 to provide additional attenuation and further minimize any signal transfer through the PA. In view of the RF environment, switches S1-S3 should be considered as attenuators since some amount of signal transfer will occur with the switch in the off or open position.

Figure 3:
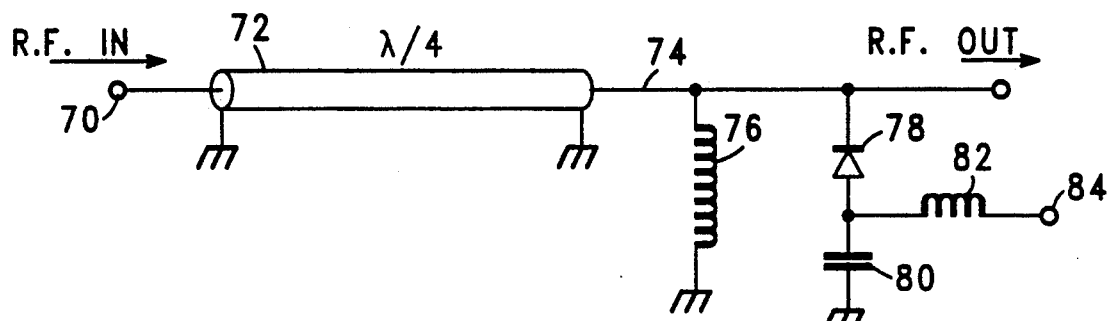
FIG. 3 is a schematic diagram of an embodiment of an RF switch utilized in the transmitter of FIG. 2.

FIG. 3 illustrates an embodiment of a PIN diode attenuator or switch which can be utilized in the present invention. The RF input signal is connected at terminal 70 to a transmission line 72 which is preferably ¼ wavelength at the frequency of operation. A high impedance RF choke 76 provides a DC ground path at terminal 74. PIN diode 78 is connected in series with capacitor 80 to form a series circuit between terminal 74 and ground. The anode of the diode is connected by a high impedance RF choke 82 with terminal 84 which receives a controlled DC current to control the impedance associated with the dioide 78. The value of capacitor 80 is selected to form a series resonant circuit with the inductance associated with the PIN diode so that a very low impedance path is presented to terminal 74 when the diode is ON. The ¼ wavelength transmission line 72 transforms the low impedance at terminal 74, when the diode is ON, into a high impedance at terminal 70 thereby attenuating the magnitude of signal that can pass from terminal 70 to terminal 74.

It will be apparent to those skilled in the art that a plurality of sections of the switch as shown in FIG. 3 can be connected in series to increase the total attenuation of the signal. Each section can provide attenuation of 20-30 decibels at RF frequencies.

In this particular switch configuration, it will be seen that the switching elements are frequency sensitive and will not provide the same level of attenuation for frequencies outside the desired range of operation. This give rise to the need for additional attenuation provided by resonator 60 as shown in FIG. 2 to prevent undesired oscillations.

Figure 4:
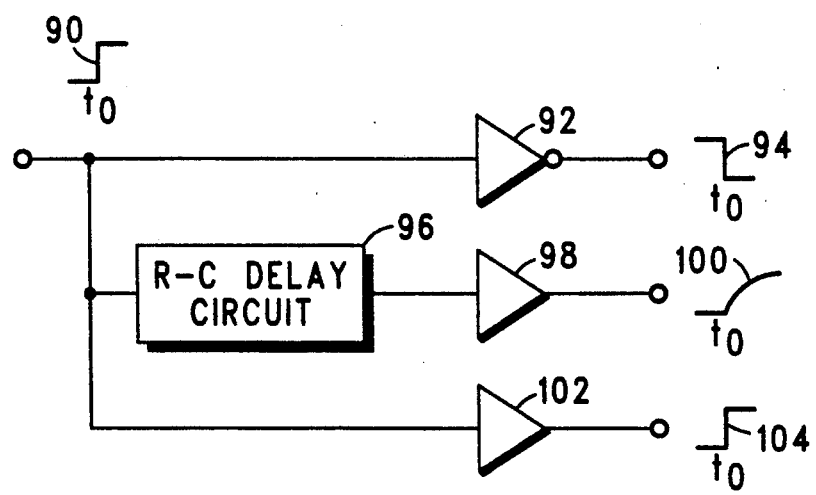
FIG. 4 is a diagram of a control circuit utilized for controlling the switches of FIG. 3.

FIG. 4 illustrates a diagram of a control circuit 62 which can be utilized to control the switches and DC power to the PA. Waveform 90 illustrates a step voltage (or current) function at time $t_o$ which is a command signal generated by the transmitter indicating that the transmitter went from an unlocked to locked state which in turn causes a corresponding transition from the short loop to the long loop. For example, each time the transmitter is keyed it usually takes a finite time for any PPL's in the transmitter to acquire lock. Inverting amplifier 92 provides a corresponding output waveform 94 which is utilized to provide a DC control signal to the PIN diode in switches S2, S3. The input commmand is delayed by RC delay circuit 96 before being amplified by amplifier 98. This results in an output waveform 100 from amplifier 98 which provides an RC time constant rise time beginning at $t_o$. Output waveform 100 is utilized to drive PIN diodes associated with switch S1. It should be remembered that when the PIN diode is conducting, the associated switch is OFF or providing maximum attenuation caused by the shunting of the signal to ground by the diode. Thus, when the short loop is active just before $t_o$, switch S1 is ON which means the associated PIN diode is not conducting.

To effect the desired gradual transition from short loop to long loop, waveform 100 is applied to the diodes associated with switch S1 to provide a gradual change from not conducting to conducting. Relative to time $t_o$, the control signal to the diodes associated with switches S2, S3 is rapidly changed to force the diodes to go as quickly as possible from conducting to nonconducting. However the lifetime of the minority carriers of the PIN diodes is such that it takes longer for the diodes to turn OFF than to be turned ON. The value of the RC delay circuit 96 is selected to match the inherent turn OFF delay associated with diodes in switches S2, S3 so as to provide a gradual change during the transition from short loop to long loop.

Input waveform 90 is amplified by amplifier 102 to provide an output waveform 104 which can be utilized to provide DC bias control to amplifier stages within PA 16. For example, waveform 104 can be applied to the base of a bipolar transistor having its collector and emitter coupled in series between the DC supply voltage and the collector of an amplifier stage. This is utilized to provide additional attenuation in the PA path when the short loop is active.

The transistion from the long loop to the short loop occurs when the polar loop circuit goes from locked to unlocked. Since the polar loop will be unlocked, the method of transition is less critical.

Although an embodiment of the present invention has been described and illustrated in the drawings, the scope of the invention is defined by the claims which follow.

What is claimed is:

1. A radio frequency (RF) transmitter comprising:
   first means for generating a first RF signal;
   RF power amplifier (PA) that linearly amplifies an input signal to produce an output signal;
   second means for generating said input signal based upon said first signal and a second signal, said input signal consisting of a predistorted signal that compensates for the nonlinear characteristics of the PA so that nonlinear difference between said first signal and said output signal are minimized, said second means including a phase locked loop (PLL) having locked and unlocked states, said PLL having a reference signal based on said input signal and a feedback signal based on said second signal; and
   third means for generating said second signal such that said second signal is based upon said input signal while said PLL changes from an unlocked state to a locked state and changing the basis of said second signal from said input signal to said output signal so that said PLL remains in the locked state, said third means inhibiting transmissions from the PA when said PLL is in its unlocked state to minimize undesired transmissions.

2. The transmitter according to claim 1 wherein said second means generates said input signal to compensate for phase and amplitude nonlinearities of said PA.

3. The transmitter according to claim 1 wherein said third means comprises means for substantially stopping said input signal from reaching the PA when said PLL is in its unlocked state.

4. The transmitter according to claim 3 wherein said stopping means couples said input signal to said second means when said PLL is in its unlocked state.

5. The transmitter according to claim 1 wherein said third means comprises means for substantially stopping said input signal from reaching said second means when said PLL is in its locked state.

6. The transmitter according to claim 5 wherein said stopping means couples said input signal to said PA and couples a signal derived from said output signal to said second means when said PLL is in its locked state.

7. The transmitter according to claim 1 wherein said third means comprises means for providing a gradual transition when said second signal changes from being based on said signal to being based on said output signal so that said PLL remains in a locked state.

8. A transmitter comprising:
first means for generating a first signal;
power amplifier (PA) that linearly amplifiers an input signal to produce an output signal;
second means for generating said input signal based upon said first signal and a second signal, said input signal consisting of a predistorted signal that compensates for the nonlinear characteristics of the PA so that nonlinear differences between said first signal and said output signal are minimized, said second means including a phase locked loop (PLL) having locked and unlocked states, said PLL having a reference signal based on said input signal and a feedback signal based on said second signal; and
third means for generating said second signal such that said second signal is based upon said input signal while said PLL changes from an unlocked state to a locked state and changing the basis of said second signal from said input signal to said output signal so that said PLL remains in the locked state, said third means inhibiting operation of the PA when said PLL is in its unlocked state to minimize undesired transmissions.

9. The transmitter according to claim 8 wherein said second means generates said input signal to compensate for phase and amplitude nonlinearities of said PA.

10. The transmitter according to claim 8 wherein said third means comprises means for substantially stopping said input signal from reaching the PA when said PLL is in its unlocked state.

11. The transmitter according to claim 10 wherein said stopping means couples said input signal to said second means when said PLL is in its unlocked state.

12. The transmitter according to claim 8 wherein said third means comprises means for substantially stopping said input signal from reaching said second means when said PLL is in its locked state.

13. The transmitter according to claim 12 wherein said stopping means couples said input signal to said PA and couples a signal corresponding to said output signal to said second means when said PLL is in its locked state.

14. The transmitter according to claim 8 wherein said third means comprises means for preventing said PLL from changing from a locked state to an unlocked state due to said second signal changing from being based on said input signal to said output signal.

15. The transmitter according to claim 1 wherein said PA operates in a linear mode of operation and said first signal is an amplitude modulated signal.

16. The transmitter according to claim 8 wherein said PA operates in a linear mode of operation and said first signal is an amplitude modulated signal.

* * * * *

UNITED STATES PATENT AND TRADEMARK OFFICE
CERTIFICATE OF CORRECTION

PATENT NO. : 5,023,937
DATED : June 11, 1991
INVENTOR(S) : George F. Opas

It is certified that error appears in the above-identified patent and that said Letters Patent is hereby corrected as shown below:

In Column 4, Claim 1, line 61, "difference" should be --differences--.

In Column 5, Claim 7, line 29, insert --input-- between "said signal".

In Column 5, Claim 8, line 33, "amplifiers" should be --amplifies--.

Signed and Sealed this

Eighth Day of December, 1992

Attest:

DOUGLAS B. COMER

*Attesting Officer*         *Acting Commissioner of Patents and Trademarks*